(12) United States Patent
Ohtsu et al.

(10) Patent No.: US 6,503,772 B1
(45) Date of Patent: Jan. 7, 2003

(54) METHOD OF MANUFACTURING A THIN FILM TRANSISTOR-INTEGRATED COLOR FILTER

(75) Inventors: Shigemi Ohtsu, Nakai-machi (JP); Keishi Shimizu, Nakai-machi (JP); Eiichi Akutsu, Nakai-machi (JP); Takao Tomono, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/455,772

(22) Filed: Dec. 7, 1999

(30) Foreign Application Priority Data

Mar. 26, 1999 (JP) .......................................... 11-084190

(51) Int. Cl.⁷ .............................................. H01L 21/00
(52) U.S. Cl. ............................. 438/30; 438/149; 430/7
(58) Field of Search ........................... 438/28–37, 149; 430/7

(56) References Cited

U.S. PATENT DOCUMENTS

| | | | | |
|---|---|---|---|---|
| 5,185,074 A | * | 2/1993 | Yokoyama et al. | 205/162 |
| 5,399,449 A | * | 3/1995 | Tanimoto et al. | 430/7 |
| 5,527,648 A | * | 6/1996 | Otsuki et al. | 430/7 |
| 6,224,735 B1 | * | 5/2001 | Akutsu et al. | 205/91 |
| 6,255,025 B1 | * | 7/2001 | Akutsu et al. | 430/7 |

FOREIGN PATENT DOCUMENTS

| | | |
|---|---|---|
| JP | B2-2-59446 | 12/1990 |
| JP | B2-3-45804 | 7/1991 |
| JP | A-5-5874 | 1/1993 |
| JP | A-5-119209 | 5/1993 |
| JP | A-5-157905 | 6/1993 |
| JP | B2-5-49967 | 7/1993 |
| JP | A-11-105418 | 4/1999 |
| JP | A-11-157198 | 6/1999 |

* cited by examiner

*Primary Examiner*—Jey Tsai
(74) *Attorney, Agent, or Firm*—Oliff & Berridge, PLC

(57) ABSTRACT

A method of manufacturing a thin film transistor-integrated color filter for use in a liquid crystal display element including a step of manufacturing a substrate for use in liquid crystal display by arranging and forming a thin film transistor and a transparent conductive film on a transparent substrate and a step of bringing the substrate for use in the liquid crystal display into contact with an aqueous electrodeposition solution containing a colorant, supplying an electric current, thereby electrochemically changing the concentration of hydrogen ions to deposit the colorant on the transparent conductive film of the substrate for use in liquid crystal display to form a colored conductive electrodeposition film. A thin film transistor-integrated color can be formed by repeating the electrodeposition film forming steps while changing the hues for the colorant, with no requirement for the alignment between the color filter and the substrate formed with the thin film transistor, a reduced number of steps, having high resolution power and high controllability, at low cost and higher performance.

21 Claims, 3 Drawing Sheets

METHOD OF MANUFACTURING A THIN FILM TRANSISTOR-INTEGRATED COLOR FILTER

BACKGROUND OP THE INVENTION

1. Field of the Invention

The present invention concerns a technique for forming a color filter used for CCD cameras, or various kinds of indicating elements, for example, liquid crystal display elements or color sensors and. it relates to a method of manufacturing colored layers or a black matrixes. More specifically. it relates to a method of manufacturing a new color filter capable of forming a colored layer or a black matrix simply and conveniently and at high resolution.

2. Description of the Related Art

Method of manufacturing color filters known at present includes (1) a dying method, (2) a pigment dispersion method, (3) a printing method, (4) an ink jet method, (5) an electrodeposition method and (6) a micelle electrolysis method.

Among them, both of (1) the dying method and (2) the pigment dispersion method have attained a high degree of technical completion and have been used generally for solid state color image pick-up devices but they require patterning by way of the step of photolithography, therefore causing a problem in view of the number of steps and high cost.

On the other hand, the printing method (3) and the ink jet method (4) require no photolithography step. However, the printing method (3) is a process of printing and then curing a thermosetting resin in which a pigment is dispersed and poor in view of resolution power or the uniformity of the film thickness. The ink jet method (4) is a process of forming a certain ink receiving layer, applying hydrophilic/hydrophobic treatment and then blowing ink to a hydrophilic portion to obtain a color filter layer but it involves a problem in view of the resolution power and high possibility of mixing color in adjacent filter layers and positional accuracy.

Color filters are generally formed by each of the methods on the side of an ITO substrate opposed to a TFT substrate. However, if the filter in formed at that position, it is necessary to positionally align the TFT substrate and the color filter substrate, making it difficult for attaining a high accuracy and increasing the cost.

The electrodeposition method (5) comprises applying a high voltage of about 70 V an a previously patterned transparent electrode in a solution of an electrolyte in which a pigment in dispersed in a water soluble polymer, and forming an electrodeposition film to conduct electrodeposition coating and repeating the steps for three times to obtain an R.G.B color filter. Since this method requires patterning for a transparent electrode by photolithography, which is used as an electrode for electrodeposition, it involves a drawback that the shape of the pattern in restricted and cannot be used for TFT liquid crystals. Further, if a color filter can be formed integrally by electrodeposition on a pixel electrode of a TFT liquid crystal substrate, no additional patterning is required. However, an electrodeposition voltage is high and it is extremely difficult to conduct electrodeposition to transparent pixel electrodes in an active matrix circuit in the existent electrodeposition method, making electrodeposition utilizing the pixel electrode of TFT impossible. Furthermore, it cannot be utilized, for example, by a reason that a driving voltage is increased since the color filter layer is insulative.

Japanese Published Examined Patent Application No. Hei 2-59446 describes to form a multi-colored device by forming a plurality of transparent conductive layers made of ITO, etc. being insulated from each other on a substrate, and repeatedly forming colored layers based on polymeric layers electrodeposited selectively on each of the conductive layers and discloses the use of a solution containing a water soluble polymer and a pigment as an electrodeposition solution. Japanese Published Examined Patent Application No. Hei 3-45804 discloses a method of using a substrate in which a TFT and a pixel electrode connected with the TFT are formed, driving the TFT in a state where the pixel electrode, a water soluble polymer and a dye-containing electrodeposition solution are in contact with each other thereby electrodepositing a colored film on a pixel electrode. Further, it describes repeating curing and formation of electrodeposition film on every color and, furthermore, forming a transparent electrode on the electrodeposition film. Japanese Published Examined Patent Application No. Hei 5-49967 discloses a method of forming a plurality of electroconductive transparent electrodes for liquid crystal display disposed being insulated on a substrate and selectively forming colored films by optionally applying a voltage selectively to the electrode.

Further, Japanese Published Unexamined Patent Application No. Hei 5-5874. for example, proposes a technique of forming a color filter integrally on the side of a TFT substrate. However, an electrodeposition film manufactured by a usual electrodeposition technique is insulative and, when the color filter is manufactured on a pixel electrode for liquid crystal driving, it cannot be utilized since the driving voltage for liquid crystals is increased. Further, impurities such as a surface active agent and the like are contained in usual electrodeposition films, purity of color or permeability is deteriorated or it is necessary to protect a TFT circuit from alkali metals contained in the film. Further, direct electrodeposition to the pixel electrodes the utilizing usual TFT driving circuits is impossible and therefore a TFT of high voltage withstand in necessary. In view of the above, a method of integrally forming a color filter substrate and a TFT substrate can not be put to practical use so far.

The micelle electrolysis method (6) is a sort of an electrodeposition method, and a voltage required for electrodeposition is lover since oxidation/reduction of ferrocene used an a deposition material is utilized, so that a color filter can be formed integrally by electrodeposition on the TFT liquid crystal substrate. However, in the thin film formed by the micelle electrolysis method, since ferrocene or surface active agent indispensable for the forming step are taken in and mixed as impurities, the color filter thus formed has poor permeability and poor color purity and has high resistivity. Further, it takes a long time such as several tens of minutes for electrodeposition to worsen the production efficiency. In addition, the ferrocene compound as the essential ingredient for electrolysis is extremely expensive to provide a problem in view of the cost.

Further, a color filter cannot generally be used as a color filter layer alone but a portion between each of the color filters and the pixel elements has to be covered with a black matrix. Usually, photolithography is used for forming the black matrix, and this is a major factor of increasing the cost. Accordingly, a method of manufacturing a color filter of a high resolution power with high controllability, and not using the photolithography and thus with less number of steps has not yet been known at present when considering the R.G.B. layer and the black matrix together, which causes poor yield and increase the cost in the production of the color filter.

SUMMARY OF THE INVENTION

The present invention provides a manufacturing method capable of manufacturing a high performance thin film transistor-integrated type color filter for use in liquid crystal display element, capable of saving alignment between a color filter and a TFT substrate, with less number of steps, reduced at the cost, having a high aperture ratio, high resolution and high controllability, by integrally forming a color filter by an electrodeposition method on the side of a substrate formed with a thin film transistor (hereinafter properly referred to as TFT).

The inventors of the present invention have reconsidered the electrodeposition technique itself in view of the principle. Then, the inventors have noted on compounds used for the method of manufacturing a filter proposed previously by the inventors as the photoelectrodeposition technique, which are water soluble and greatly changes water solubility depending on oxidized, neutral and reduced states, and have found that the electrodeposition materials can be used suitably also for forming a color filter on a TFT substrate as in the present invention without causing the problems as described above, and have accomplished the present invention.

The change of pH aqueous solutions utilized here generally occurs by way of electrolysis of water. Therefore, the start point of the voltage required for electrodeposition is an oxidation/reduction potential of water and an electrodeposition film is formed at a voltage much lower than that required so far for electrodeposition.

The electroconductive electrodeposition film and the technique relevant thereto proposed by the present inventors are based on the above findings and the outline for the method of forming images in the present invention resides in integral formation of a conductive color filter layer on a transparent semiconductor pixel electrode having a TFT circuit selectively as three color filter layers while utilizing the TFT circuit as it is.

That is, a method of manufacturing a thin film transistor-integrated type color filter according to the present invention comprises a transparent substrate manufacturing step of arranging and forming a thin film transistor and a transparent conductive film on a transparent substrate thereby forming a substrate for use in liquid crystal display and a step of bringing the substrate for use in liquid crystal display into contact with an aqueous electrodeposition solution containing a colorant, supplying an electric current, electrochemically changing the concentration of hydrogen ions thereby depositing the colorant on a transparent conductive film of the substrate for use in liquid crystal display and forming a conductive colored electrodeposition film.

According to the present invention, since a color filter of full three colors is formed on a pixel electrode of a TFT substrate by forming a color filter layer of the first color, among three colors of red (R), green (G) and blue (B), by electrodeposition only in a predetermined region using a transparent substrate in which a thin film transistor and a transparent conductive film are arranged and formed by utilizing an active matrix circuit thereof and then repeating the procedures for each of the colors, the color filter is formed on every pixel by a simple and convenient method and since they are formed directly on the TFT substrate, no alignment is necessary when it is used for liquid crystal display.

Upon forming the electrodeposition film, it is preferred to adopt a step of coating a photoresist on the substrate for use in liquid crystal display to expose the transparent conductive film by etching only at the predetermined region by entering a light on the side not formed with the transparent electrode in view of the protection for the TFT Circuit. In this embodiment, only the exposed portion of the transparent conductive film is brought into contact with the electrodeposition film and the electrodeposition film can be formed only at the portion by driving a predetermined electrode, while other portions are protected by the resist. In this case, if a positive type black resist material is used, the portion forms a black matrix.

Further, as a similar protection unit, it is also possible to dispose a protection film on the thin film transistor as an insulation film and form a colored electrodeposition film only for a predetermined portion by driving a predetermined electrode of the exposed transparent conductive film with no provision of the protection layer.

Further the black matrix can also be formed by separately providing a step of forming an insulative black matrix after forming a color filter by any of the manufacturing methods described above.

When a color filter is formed by previously disposing the transparent photoresist as described above, it is also possible to apply a step of forming a black matrix by subsequently removing the photoresist, disposing an insulative protection film for insulation from both of the color filter and the thin film transistor and then forming a black matrix on the protection layer.

In the manufacturing method according to the present invention, when the thin film transistor and the transparent conductive film are arranged and formed, the electrode portion can be provided with the same function as the black matrix by making the electrode of a low reflectance material, in which the step of forming the black matrix is not necessary.

In the same manner, by forming the electrode with a low reflectance material upon arranging and forming the thin film transistor and the transparent conductive film, further disposing an insulation layer to the electrode and then forming a pixel electrode, the electrodes and the electrode line can be provided with the same function as the black matrix.

In the method of manufacturing the color filter according to the present invention, the electrodeposition material used for an electrodeposition solution for forming the electrodeposition film preferably contains an electrodepositing dye or an electrodepositing polymer having carboxyl groups and having a nature of changing the solubility thereby causing deposition in accordance with the concentration of hydrogen ions. In this ease, if the dye itself has the electrodepositing property, additional use of a colorant is not particularly necessary, except for the purpose of controlling the hue. However, when a colorless or monocolor electrodepositing polymer is used, it is necessary to use a colorant having a desired hue together.

The electrodepositing polymer is preferably an electrodepositing polymer which is a copolymer of monomers having hydrophobic groups and hydrophilic groups, and in which the ratio of the number of hydrophobic groups based on the total number of the hydrophobic groups and the hydrophilic groups is from 40% to 80%, or an electrodepositing polymer which is a copolymer of monomers having hydrophilic groups.

In view of the purpose of forming a conductive color filter layer, the manufacturing method according to the present invention may adopt, a method of adding and dispersing fine particles of a highly conductive colorant or a transparent conductive material in an electrodeposition solution, or a method of adding, mixing and dispersing a salt giving no undesired effects on a TFT circuit as a conductive material. More specifically, when a highly conductive colorant is used, it is preferred to increase the ratio of the conductive material by using the electrodepositing polymer at a ratio of 1.5 or less relative to 1 for the conductive colorant, based on the weight % concentration ratio of the electrodepositing polymer and the conductive colorant.

Another embodiment of such conductive color filter layer can be obtained by forming a conductive electrodeposition film by the above-described unit and then forming a protection layer on the electrodeposition film in a state containing water in the electrodeposition film, so that electric charges can move in the electrodeposition film.

According to the manufacturing method of the present invention, the electrodeposition voltage required for forming an electrodeposition film in the step of forming an electrodeposition film can be lowered to 5 V or lower.

Further, in the step of forming a transparent substrate, a liquid crystal display element with a high aperture ratio and of high brightness can be attained by using a metal material of low reflectivity such as two- or three-layered Cr for the electrode upon forming the thin film transistor, by which the aperture ratio can be increased to the maximum, with no requirement for the black matrix.

BRIEF DESCRIPTION OF THE DRAWINGS

Preferred embodiments of the present invention will be described in detail based on the drawings.

DESCRIPTION FOR THE PREFERRED EMBODIMENTS OF THE INVENTION

The present invention will be explained more in details.

In the method of manufacturing a thin film transistor-integrated type color filter according to the present invention, it is important to use an electrodeposition material capable of electron deposition at a low voltage.

Such materials can include, preferably, those reversibly causing dissolution and deposition depending on the change of the concentration of hydrogen ions. That is, molecules which lower the solubility to form deposition in an alkaline or acidic region are preferred. The depositing molecule may be a colorant itself such as a dye, or may be a transparent polymeric material having a nature of causing deposition in an alkaline or acidic state. If the deposited material is transparent or of a monocolor, a colorant is used being dispersed in a polymer. When the colorant is dispersed together with the polymer and used, not only the dye but also the pigment can be used. When this is utilized as a color filter, it is desirable to use a pigment dispersed in the aqueous polymer since it has a high light fastness.

For the example of the polymer as such electrodeposition materials, explanation will be made with reference to a water soluble acrylic resin having carboxyl groups. The material has a nature of easily dissolving into a weakly alkaline water (pH 8 to 9), and in present in an aqueous solution as anions but turns insoluble to cause deposition at pH of 7 or lower. When a platinum electrode is immersed in the aqueous solution and electric current is supplied, $OH^-$ ions near the anode in the aqueous solution are consumed into $O_2$ and the hydrogen ions are increased to lower pH. This is because the following reaction is taken place near the anode in which hole (p) and $OH^-$ ion are combined as below.

$2OH^- + 2p^+ \rightarrow \frac{1}{2}(O_2) + H_2O$

A certain voltage in necessary for the occurrence of the reaction and the concentration of hydrogen ions in the aqueous solution increases to lower pH in accordance with the progress of the reaction. Accordingly, when a voltage higher than a certain level is applied, the solubility of the water soluble acrylic resin is lowered to become insoluble on the side of the anode of the electrode and a thin film is formed on the electrode.

In the step of forming the electrodeposition film according to the present invention, such oxidation/reduction potential of water described above is utilized. Accordingly, an electrodeposition film can be formed at an extremely low voltage. In the known substrate forming techniques using electrodeposition, for example, in the electrodeposition materials described in Japanese Published Unexamined Patent Application No. Hei 5-119209 (Dai Nippon Printing, "Method of Manufacturing Color Filter and Electrodeposition Substrate for Use in Manufacture of Color Filter"), Japanese Published Unexamined Patent Application No. Hei 5-157905 ("Method of Manufacturing Color Filter"), since the oxidation/reduction reaction of the polymer used in principle, the electrodeposition voltage be lowered but the electrodeposition voltage is as high as 20 v to 100 V, so that such materials cannot be applied to the TFT circuit as in the present invention.

With respect to the structure of the electrodeposition materials for use in filters, polymeric materials polymerized at random comprising a copolymer having, as a minimum monomer unit, a molecule having ionically dissociating hydrophilic groups and hydrophobic groups promoting insolubilization to water are preferred. Those comprising the monomer unit of the polymerized electrodeposition material in which a ratio of the number of hydrophobic groups based on the total number of the hydrophilic groups and the hydrophobic groups is within a range from 40% to 80%, more preferably, from 55% to 70%, have particularly high electrodeposition efficiency, exhibit electrodeposition characteristics capable of forming a film at a low electrodeposition potential and are stabilized for the liquid property of the electrodeposition solution.

If the ratio of the number of hydrophobic groups of the monomer unit in the electrodeposition material based on the total number of the hydrophilic groups and the hydrophobic groups is less than 40%, the electrodeposition film formed upon electrodeposition is easily solubilized again. Then, if the ratio of the number of the hydrophobic groups based on the total number of the hydrophilic groups and the hydrophobic groups in the electrodeposition material is 80% or more, solubility to the aqueous solution becomes insufficient, to sometimes cause problems in that the electrodeposition solution turned cloudy or caused, precipitation of the electrodeposition material, or increased viscosity.

Since the hydrophobic groups in the structure of the electrodeposition material for the filter have a strong affinity and adsorbing performance to the organic pigment used as the colorant and provide a favorable pigment dispersing function, they facilitate manufacture of a color filter of high transmissivity.

A preferred electrodeposition characteristic can be obtained within an acid value of the electrodeposition material from 60 to 300, particularly, within a range from 90 to 195. If the acid value of the electrodeposition material is 60 or less, solubility to the aqueous solution is insufficient making it impossible to increase the solid concentration of the electrodeposition solution to an appropriate value, the solution becomes cloudy or causes precipitates, and the viscosity of the solution is increased. Further, if the acid value of the electrodeposition material is 300 or more, once formed film tends to be dissolved again.

Further, it is necessary that the electrodeposition solution in which the electrodeposition material is dissolved has such a hysteresis characteristic that it causes an abrupt change of state of causing precipitation relative to the change of the pH value and it is less soluble again. According to this characteristic, a thin film is formed instantaneously even by abrupt pH change upon supply of electric current and redissolution to the electrodeposition solution becomes difficult to form a thin film.

Monomer materials containing hydrophilic groups used for the electrodeposition material used in the manufacturing method of the present invention can include, for example, methacylic acid, acrylic acid, hydroxyethyl methacrylate, acrylamide, maleic acid anhydride, trimellitic acid anhydride, phthalic acid anhydride, hemimellitic acid, succinic acid, adipic acid, propiolic acid, propionic acid, fumaric acid, itaconic acid and derivatives thereof. Particularly, methacrylic acid and acrylic acid are useful hydrophilic monomer materials since they have high electrodeposition efficiency due to pH change.

Further, the monomer material containing hydrophobic groups used for the electrodeposition material can include, for example, those having alkyl group, styrene group, α-methyl styrene group, α-ethyl styrene group, methyl methacrylate group, butyl methacrylate group, acrylonitrile group, vinyl acetate group, ethyl acrylate group, butyl acrylate group, lauryl methacrylate group and derivatives thereof. Particularly, since styrene group and α-methyl styrene group have strong hydrophilic property, materials containing them are useful hydrophobic monomeric materials capable of easily obtaining the hysteresis characteristic to the re-dissolution.

The electrodepositing polymer utilized in this invention is a polymer material formed by copolymerizing molecules containing such hydrophilic groups and hydrophobic groups at the ratio as described above in which the species of each of the hydrophilic groups and the hydrophobic groups is not restricted to only one kind. A polymeric material having a polymerization degree from 6,000 to 25,000 can provide satisfactory electrodeposition films. A material having a polymerization degree of from 9,000 to 20,000 is more preferred. If the polymerization degree is lower then 6,000, the material becomes easily soluble again. If the polymerization degree is higher than 25,000, solubility to the aqueous solution is insufficient, by which the solution becomes cloudy or causes precipitation to bring about problems.

The colorant utilized in the present invention can include pigments and dyes. The colorant itself can be utilized irrespective of absence or presence or the electrodeposition property. That is, as an example of the colorant having the electrodeposition property in itself, Rose Bengal or Eosin as a fluorecein pigment is reduced at a pH of 4 or higher and is soluble to water and it is oxidized into a neutral state and precipitates at a lower pH. In the same manner, diazo type Pro Jet Fast Yellow 2, or certain kind of water soluble acrylic resin is soluble to water at pH of 6 or higher and precipitates at a lower pH value. When the molecules are dissolved in purified water and a voltage is applied to an electrode immersed in the solution, an electrodeposition film comprising the molecules are formed on the electrode at the anode. The electrodeposition film can be leached again into the aqueous solution either by applying an inverse voltage or by immersion into an aqueous solution at pH from 10 to 12. As described above, Rose Bengal, Eosin or Pro Jet Fast Yellow 2 is a material having an electrodeposition film-forming capability by itself. Such a dye can be used alone for forming a colored electrodeposition film. Further, those colorants disclosed by the present inventors in the specification proposed as Japanese Published Unexamined Patent Applications Nos. Hei 11-105418 and Hei 11-157198proposed previously as the material suitable to the photoelectrodeposition method can also be used.

On the other hand, when the known pigment or dye is used as the colorant, it is taken into a material having a film-forming capability upon forming the electrodeposition film by combined use with a colorless or pale colored polymeric electrodeposition material described previously. When the pigment is used, those having a grain size of 0.1 μm or less are preferred in view of the transparency of the filter and the dispersibility.

Combination of the electrodeposition material and the colorant is optional so long as the effect of forming the electrodeposition film is not impaired, and various mixtures can be used, for example, a mixture of molecules or an identical polarity such as a mixture of two or more kinds of anionic molecules or a mixture of two or more kinds of cationic molecules, a mixture of molecules of different polarities such as a mixture of an anionic molecule and a cationic molecule, a mixture of a dye and a pigment and a mixture of a polymer and a pigment. When two or more kinds of colorants are used, optional mixed colors can be obtained.

When the mixture is used for the electrodeposition material, it is necessary that at least one or more kinds of molecules have the electrodepositing property capable of forming a thin film by itself by the change of the solubility depending on the pH change. As described above, if one of them is an electrodepositing material, when various materials not having thin film-forming capability are dispersed in an electrodeposition solution, they are taken into the electrodepositing material upon forming the electrodeposition film and fixed in the filter.

The material to be mixed in the electrodeposition solution may be ionic or not. Further, ions may have polarity. For example, a came of mixing two kinds of ions is assumed. Generally, when a basic solution and an acidic solution are mixed, they are neutralized and precipitated while forming different precipitates such as complex salts. Therefore, when two kinds of pigments are mixed to obtain a mixed color, it is normal to use pigments of non-polarity or disperse materials of an identical polarity. By the way, certain kinds of dyes do not form complex salts but form an ion-coexistent state. In this case, deposition of precipitates can be suppressed even when the basic solution and the acidic solution are mixed and they can be used irrespective of the polarity of the ions.

When the color filter layer formed by the electrodeposition method is provided with electroconductivity, there can be mentioned a method of using a conductive pigment or a method of dispersing fine particles of transparent conductive material. For keeping the dispersed state, it is necessary that the grain size of the fine particles of the conductive material is 0.1 μm or less and they cannot be dispersed stably if the grin size is larger.

The conductive pigment can include, specifically, carbon, phthalocyanine or perylene. The transparent conductivity material can include, specifically, $TiO_2$, $SnO_2$, ZnO, $In_2O_3$ or ITO.

In addition, there can also be mentioned a method of adding a salt giving no undesired effects on the characteristics of the thin film transistor, for example, tetraalkyl ammonium in the electrodeposition film or a method of forming a protection layer on the surface in a state where the formed electrodeposition film contains water.

The conductivity of the electrodeposition solution is to be described next. According to our experiment, the conductivity is concerned with an electrodeposition speed, namely, an amount of electrodeposition. As the conductivity is higher, the thickness of the electrodeposition film adhered for a predetermined period of time is increased and it is saturated at about 100 $mS/cm^2$. Accordingly, if the conductivity is not sufficient by using only the electrodepositing polymer or the electrodepositing dye ions, the electrodeposition speed can be controlled by adding ions giving no effects on the electrodeposition, for example, $NH_4^+$ ions or $Cl^-$ ions. Usually, the electroconductivity of the electrodeposition solution is increased by adding a carrier salt. The carrier salts used generally in electrochemistry can include, for example, alkali metals such as NaCl and KCl, and tetraalkyl ammonium salts such as tetramethyl ammonium perchlorate ($Mt_4NClO_4$). However, in the case of lamination with a thin film transistor, the alkali metal cannot be used since it gives undesired effects on the characteristics of the thin film transistor. In view of the above, it is preferred in the method of the present invention to use halogen type ammonium ions such as $NH_4Cl$ or tetraalkyl amnonium salts such an $Mt_4NCl$, $Mt_4NClO_4$, $Et_4NCl$, $Et_4NClO_4$, n-$Bu_4NCl_4$, $Mt_4NBF_4$, $Mt_4NBr$, $Et_4NBF_4$, $Et_4NBr$ or n-$Bu_4NBr$. This is because such compounds, if they are present in the electrodeposition film, are eliminated by heating or give no undesired effects on the transistor characteristic if they remain.

Further, pH of the aqueous solution naturally gives an effect on the formation of the electrodeposition film. For example, when the electrodeposition film is formed under such a condition that the solubility of the pigment molecules is saturated before forming the electrodeposition film, it is hard to dissolve again after forming the film. However, when the electrodeposition film in formed at a pH value for the solution in a not saturated state, the electrodeposition film, even when formed, start to be dissolved again as soon as the current supplies is terminated. Accordingly, it is desirable to form the electrodeposition film at such a pH value in which to saturate the solubility. Accordingly, it is necessary to control pH to a desired value by using an acid or alkali. Also in this case, inorganic alkali cannot be used by the same reason as described above. Accordingly, amine or ammonia type organic alkali material in used. Particularly, tetramethyl hydroxide has been used frequently as an etching solution for a photoresist and can be utilized suitably since it has a good compatibility with the thin film transistor.

Then, a method of forming a thin film transistor (TFT) and a color filter on one identical substrate will be explained. For forming the color filter, it has been known a method of foaming a color filter layer of a predetermined color by utilizing a TFT driving circuit by an electrodeposition method only to a predetermined pixel. The method is described specifically, for example, in Japanese Published Unexamined Patent Application No. Hei 5-5874. However, since an electrodeposition film manufactured by the usual electrodeposition technique is insulative, when a color filter is manufactured on a pixel electrode for a liquid crystal driving, the driving voltage of the liquid crystal is increased, so that it cannot be utilized. Therefore, it is necessary to manufacture a electroconductive color filter film. Although, it has been known that compositions are substantially identical for the color filter film manufactured by the method utilized in our invention, and the materials such an the water soluble polymer and the pigment in the electrodeposition solution and the electroconductivity can be controlled optionally by dispersing the transparent conductive material or dispersing the conductive pigment. Further, since the electrodeposition film formed by using the micelle electrolysis method contains impurities such as a surface active agent, purity of color or transmissivity is lowered to cause undesired effects on the film characteristics. However, anions are scarcely contained in the electrodeposition film formed by utilizing the change of the solubility depending on pH used in the present invention. Furthermore, while cations are present in the film in the form to be substituted with the polymer, it has been found that alkali metal can be eliminated thoroughly by utilizing ammonium ions and the like. In view of the above, it has become possible for the first time to form and use the color filter substrate and the TFT substrate integrally.

Then, a method of forming a color filter, a protection layer and a black matrix on a TFT thin film will be explained specifically.

Figure 1:
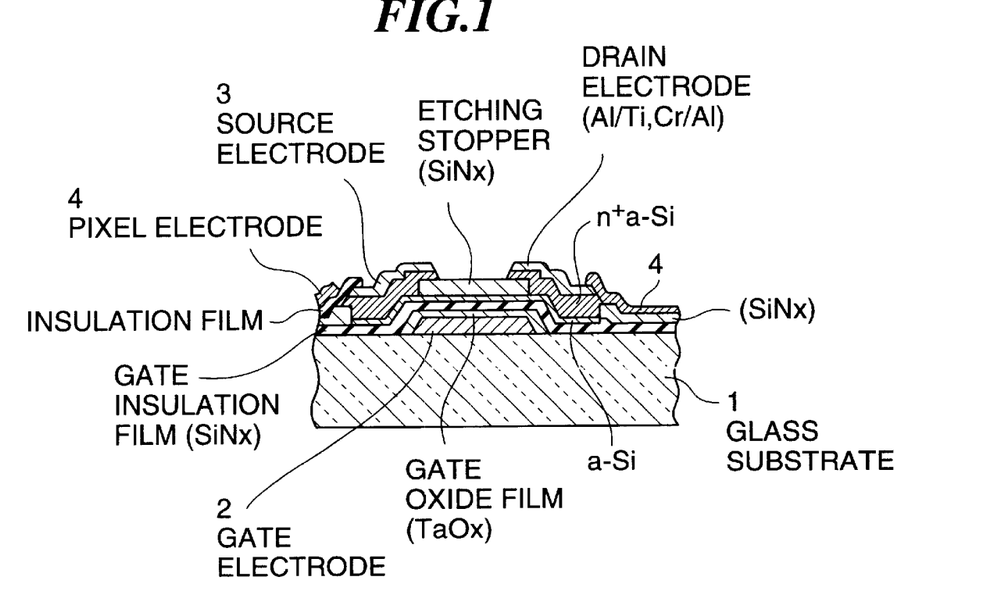
FIG. 1 is a schematic cross sectional view illustrating a device structure of a general thin film transistor.

FIG. 1 shows a general structure of a TFT. A protection film for the TFT thin file has been well known so far, for which a material such as $SiN_x$ as an etching stopper can be utilized. However, it can be applied more effectively by utilizing a photoresist.

Figure 2A:
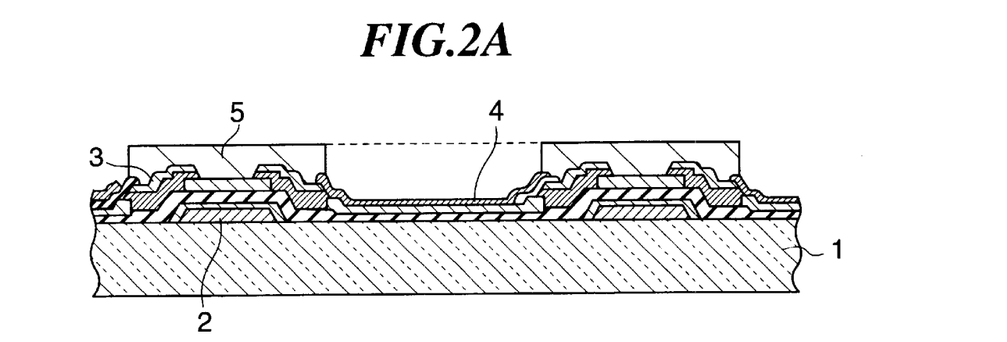
FIG. 2A and FIG. 2B are schematic cross sectional views illustrating steps of manufacturing a thin film transistor-integrated type color filter including a step of disposing a protection layer by using a positive type resist.

As an example, explanation will be made to a came of using a photoresist in the manufacturing method according to the present invention. At first, after forming a TFT device comprising a gate electrode 2, a source electrode 3 and an ITO pixel electrode 4 on a transparent glass substrate 1 by a usual method (refer to FIG. 1), a positive dyes photoresist 5 is coated. As shown in FIG. 2A, when a light is irradiated (shown by an arrow in the figure), the gate electrode 2 and the source electrode 3 of the TFT act as a photomask, and the resist 5 functions as an insulation layer. On the other hand, since the light transmits through the surface of the pixel electrode 4, a portion of the photoresist indicated by a dotted line in the figure is etched and the ITO electrode 4 is exposed. Then, when the electrodeposition solution is brought into contact with the region and the TFT circuit is driven, an electrodeposition material is deposited on the surface of the ITO electrode 4 to form an electrodeposition film 6 selectively, and the electrodeposition film 6 forms a color filter layer of a single color. In this step, a protection layer is formed by the resist 5 on the surface of the gate electrode 2 and the source electrode 3, which are not in contact with the electrodeposition solution.

Figure 2B:
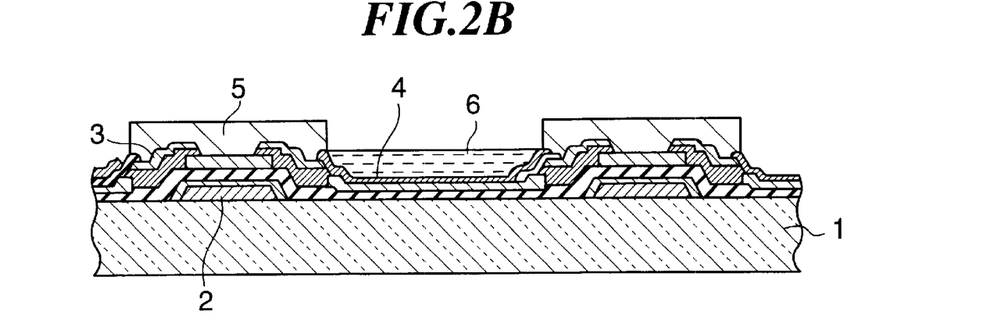
Figure 3:
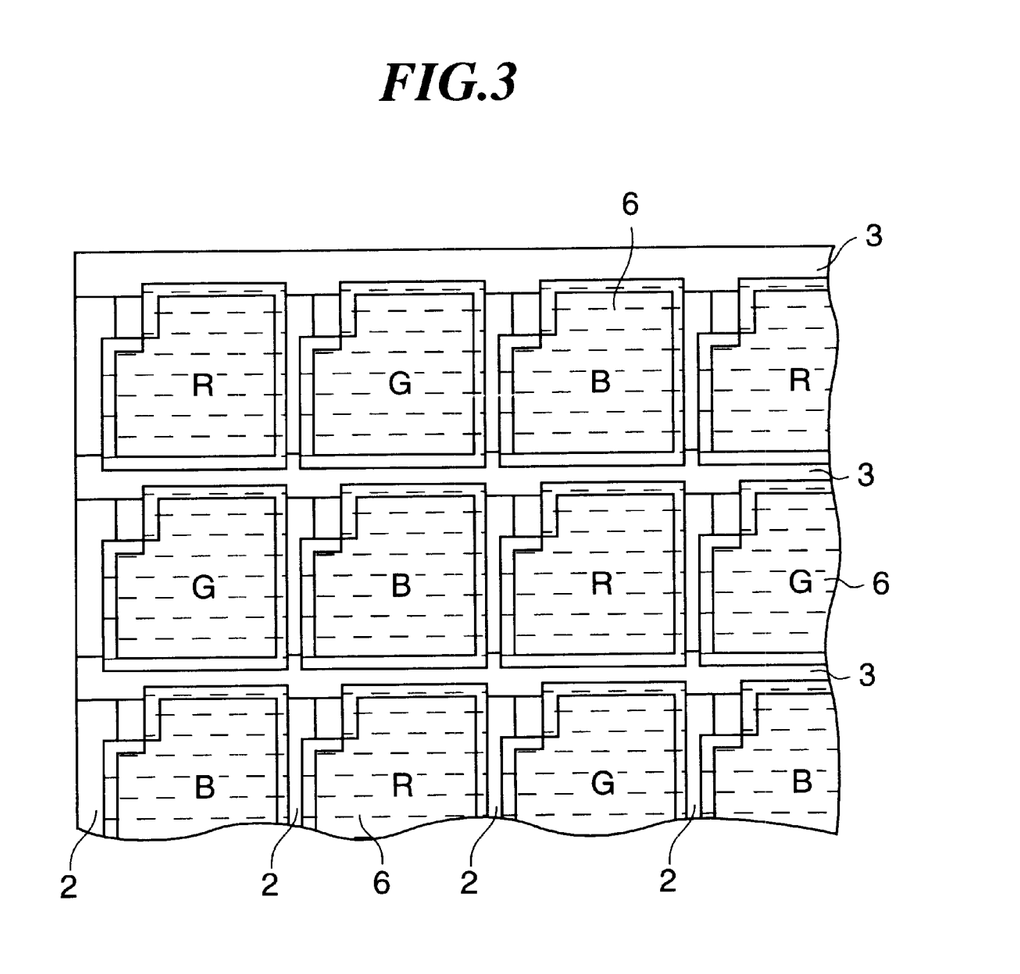
FIG. 3 is a front elevational view illustrating a structure of a thin film transistor-integrated type color filter.

A color filter of full color can be formed by using a colorant of one of colors R, G, B for this electrodeposition film and in the same manner, by forming color filter layers with respect to other hues successively at predetermined positions while replacing the electrodeposition solutions and controlling the positions of the driving circuit for forming the electrodeposition films.

As has been described above, a black matrix is indispensable for the color filter and an optical density usually of 2.5 or more is required for the black matrix, so that it does not leak light.

In the method according to the present invention, since the gate electrode and the source electrode of the TFT circuit are present in the portions not formed with the color filter, the portions have the light shielding property. Accordingly, if the gate electrode or the source electrode is formed of a metal film of low reflectivity, for example, of a two-layered Cr film, there in no particular requirement for providing the black matrix. That is, since the power source line or the electrodes of the TFT circuit function as the black matrix, the aperture ratio of the color filter can be increased to the maximum and a highly bright and fine liquid crystal display can be formed. Accordingly, when the color filter and the TFT circuit are formed integrally as shown in the present invention, a most desirable constitution can obtained in that the positional alignment is simplified and the cost is reduced, as well as the function for the brightness and the high resolution power greatly exceeds the limit in the prior art.

However, this does not exclude the provision of the black matrix above the TFT circuit as in the usual method. The method of manufacturing the black matrix can include a method of using the black resist material as a positive type photoresist used for forming the protection layer. While this method is the most simple and convenient, a method of forming a metal series black matrix by a customary method can also be utilized so long as insulation with respect to the color filter layer can be kept. A method of forming a black matrix only to a portion not formed with the color filter layer by using a UV-curable resin can also be utilized.

EXAMPLES

The present invention is to be described more in details with reference to examples, but the invention is not restricted to them.

Example 1

As shown in FIG. 1, a thin film transistor (TFT) and a pixel electrode of a transparent conductive film (ITO) were formed on an alkaline glass substrate of 0.7 m in thickness (1737 glass manufactured by Corning Inc.). In this case, the gate electrode and the drain electrode of the TFT were formed of a two-layered chromium film. After disposing an insulation layer with silicon nitride so that the electrode and power source line portions can be used both as a black matrix after forming the color filter layer, the ITO was extended upon forming the pixel electrode so as to overlap the power source line to thereby eliminate a transparent region other than the pixel electrode, which was utilized as a TFT substrate (manufacturing step of substrate for use in liquid crystal display).

Then, in a state of applying a voltage to the gate electrode of the TFT substrate such that red is entirely indicated upon liquid crystal display, a substrate was brought into contact with an electrodeposition solution (pH=7.8. conductivity=10 mS/cm) containing a styrene-acrylic acid copolymer (molecular weight: 13,000, hydrophilic group/ (hydrophobic group+hydrophilic group) molar ratio: 65%, acid value: 150) and an azo series red super-micro particle pigment at a 1:2 solid content ratio, and a voltage was applied for 10 seconds by a potentiostat with a potential of the pixel electrode as an operation electrode relative to a saturated calomel electrode of 2.5 V. Platinum black was used for a counter electrode.

As a result, a red color filter was formed on the pixel electrode (electrodeposition film forming step: Red).

Then, after cleaning with purified water, the electrodeposition solution was replaced with an electrode deposition solution in which a styrene-acrylic acid copolymer (molecular weight: 13,000, hydrophobic group/(hydrophilic group+hydrophobic group) molar ratio: 65%, acid value: 150) and a phthalocyanine green series super-micro particle pigment were dispersed at 1:2 solid content ratio and, simultaneously, when voltage at 2.5 V was applied for 10 seconds to the pixel electrode in a state of applying a voltage to the TFT substrate such that green is displayed entirely upon liquid crystal display, a green color filter was formed on the pixel electrode.

Then, after cleaning with purified water, the electrodeposition solution was replaced with an electrode deposition solution in which a styrene-acrylic acid copolymer (molecular weight: 13,000, hydrophobic group/(hydrophilic group+hydrophobic group) molar ratio: 65%, acid value: 150) and a phthalocyanine blue series super-micro particle pigment were dispersed at a 1:2 solid content ratio and, simultaneously, when voltage at 2.5 V was applied for 10 seconds to the pixel electrode in a state of applying a voltage to the TFT substrate such that green is displayed entirely upon liquid crystal display, a blue color filter was formed on the pixel electrode (electrodeposition film forming step: Blue).

The step of forming the electrodeposition film was repeated as described above and color filters each of a single color were successively formed on exposed predetermined pixel electrodes and, as a result, a full color TFT-integrated color filter was formed. As can be seen from the process, the color filter was formed integrally over the surface of the TFT.

Example 2

As shown in FIG. 1, a thin film transistor (TFT) and a pixel electrode of a transparent conductive film (ITO) are formed on an alkaline glass substrate of 0.7 mm in thickness (1737 glass manufactured by Corning Inc.) (manufacturing step of substrate for use in liquid crystal display).

Then, a positive type black resist was coated on the TFT substrate, light is irradiated from the back surface of the substrate and only the light irradiated region was etched to expose a pixel electrode (black matrix forming step).

Then, in a state of applying a voltage to of the TFT substrate such that red in entirely indicated upon liquid crystal display, the substrate was brought into contact with an electrodeposition solution (pH=7.9. conductivity=10 mS/cm) containing a styrene-acrylic acid copolymer (molecular weight: 13,000, hydrophilic group/(hydrophobic group+hydrophilic group) molar ratio: 65%, acid value: 150) and an azo series red super-micro particle pigment at a 1:2 solid content ratio, and a voltage was applied for 10 seconds by a potentiostat with a potential of the pixel electrode as an operation electrode relative to a saturated calomel electrode of 2.5 V. Platinum black was used for a counter electrode. As a result, a red color filter was formed on the pixel electrode (electrodeposition film forming step: Red).

Then, after cleaning with purified water, the electrodeposition solution was replaced with an electrode deposition solution in which a styrene-acrylic acid copolymer (molecular weight: 13,000, hydrophobic group/(hydrophilic group+hydrophobic group) molar ratio; 65%, acid value: 150) and a phthalocyanine green series super-micro particle pigment were dispersed at 1:2 solid content ratio and, simultaneously, when voltage at 2.5 V was applied for 10 seconds to the pixel electrode in a state of applying a voltage to the TFT substrate such that green is displayed entirely upon liquid crystal display, a green color filter was formed on the pixel electrode (electrodeposition film forming step: Green).

Then, after cleaning with purified water, the electrodeposition solution was replaced with an electrode deposition solution in which a styrene-acrylic acid copolymer (molecular weight: 13,000, hydrophobic group/(hydrophilic group+hydrophobic group) molar ratio: 65%, acid value: 150) and a phthalocyanine blue series super-micro particle pigment were dispersed at a 1:2 solid content ratio and, simultaneously, when voltage at 2.5 V was applied for 10 seconds to the pixel electrode in a state of applying a voltage to the TFT substrate such that blue is displayed entirely upon liquid crystal display, a blue color filter was formed on the pixel electrode (electrodeposition film forming step: Blue).

The step of forming the electrodeposition film was repeated as described above and color filters each of a single color were successively formed on exposed predetermined pixel electrodes and, as a result, a full color TFT-integrated color filter was formed.

Example 3

As shown in FIG. 1, a thin film transistor (TFT) and a pixel electrode of a transparent electrode conductive film (ITO) were formed on an alkaline glass substrate (1737 glass manufactured by Corning Inc.) of 0.7 mm in thickness. In this case, the gate electrode and the drain electrode of the TFT were formed of two layered chromium files to provide the electrode with low reflectivity and light shielding property (manufacturing step for substrate for use in liquid crystal display).

The positive type resist was coated on the TFT substrate, a light war irradiated on the back surface of the substrate and only the light irradiation region was etched to expose the pixel electrode. Then, in a state of applying a voltage to the gate electrode of the TFT substrate such that red is entirely indicated upon liquid crystal display, a substrate was brought into contact with an electrodeposition solution (pH=7.8. conductivity=10 mS/cm) containing a styrene-acrylic acid copolymer (molecular weight: 13,000, hydrophilic group/(hydrophobic group+hydrophilic group) molar ratio: 65%, acid value: 150) and an azo series red super-micro particle pigment at a 1:2 solid content ratio, and a voltage was applied for 10 seconds by a potentiostat with a potential of the pixel electrode as an operation electrode relative to a saturated calomel electrode of 2.5 V. Platinum black was used for a counter electrode. As a result, a red color filter was formed on the pixel electrode (electrodeposition film forming steps Red).

Then, after cleaning with purified water, the electrodeposition solution was replaced with an electrode deposition solution in which a styrene-acrylic acid copolymer (molecular weight: 13,000, hydrophobic group/(hydrophilic group+hydrophobic group) molar ratio: 65%. acid value: 150) and a phthalocyanine green series super-micro particle pigment were dispersed at 1:2 solid content ratio and, simultaneously, when voltage at 2.5 V was applied for 10 seconds to the pixel electrode in a state of applying a voltage to the TFT substrate such that green is displayed entirely upon liquid crystal display, a green color filter was formed on the pixel electrode (electrodeposition film forming step: Green).

Then, after cleaning with purified water, the electrodeposition solution was replaced with an electrode deposition solution in which a styrene-acrylic acid copolymer (molecular weight: 13,000, hydrophobic group/(hydrophilic group+hydrophobic group) molar ratio: 65%, acid value: 150) and a phthalocyanine blue series super-micro particle pigment were dispersed at a 1:2 solid content ratio and, simultaneously, when voltage at 2.5 V was applied for 10 seconds to the pixel electrode in a state of applying a voltage to the TFT substrate such that green is displayed entirely upon liquid crystal display, a blue color filter was formed on the pixel electrode (electrodeposition film forming step: Blue).

The electrodeposition film forming steps are thus repeated thereby forming color filters each of a single color successively on the exposed predetermined pixel electrode and, as a result, a full color TFT-integrated type color filter was formed.

Further, the filter was coated with a UV-ray curable resin containing black, and a black matrix was formed only in the region of leaking light when irradiated from the back surface of the substrate (black matrix forming step).

With the procedures, a TFT-integrated type color filter providing the black matrix was formed by the process.

Example 4

As shown in FIG. 1, a thin film transistor (TFT) and a pixel electrode of a transparent conductive film (ITO) were formed on an alkaline glass substrate of 0.7 mm in thickness (1737 glass manufactured by Corning Inc.). In this case, the gate electrode and the drain electrode of the TFT were formed of a two-layered chromium film. After disposing an insulation layer with silicon nitride so that the electrode and power source line portions can be used both as a black matrix after forming the color filter layer, the ITO was extended upon forming the pixel electrode so as to overlap the power source line to thereby eliminate a transparent region other than the pixel electrode, which was utilized as a TFT substrate (manufacturing step of substrate for use in liquid crystal display).

Then, in a state of applying a voltage to the gate electrode of the TFT substrate such that red is entirely indicated upon liquid crystal display, a substrate was brought into contact with an electrodeposition solution (pH=7.8. conductivity=10 mS/cm) containing a styrene-acrylic acid copolymer (molecular weight: 13,000, hydrophilic group/ (hydrophobic group+hydrophilic group) molar ratio: 65%, acid value: 150), an azo series red super-micro particle pigment and ITO micro particles (grain size; about 50 nm) at a 1;1:1 solid content ratio, and a voltage was applied for 10 seconds by a potentiostat with a potential of the pixel electrode as an operation electrode relative to a saturated calomel electrode of 2.5 V. Platinum black was used for a counter electrode. As a result, a red color filter was formed on the pixel electrode (electrodeposition film forming step: Red).

Then, after cleaning with purified water, the electrodeposition solution was replaced with an electrode deposition solution in which a styrene-acrylic acid copolymer (molecular weight: 13,000, hydrophobic group/(hydrophilic group+hydrophobic group) molar ratio: 65%, acid value: 150), a phthalocyanine green series super-micro particle pigment and ITO micro particles (grain size; about 50 nm) were dispersed at 1:1:1 solid content ratio and, simultaneously, when voltage at 2.5 V was applied for 10 seconds to the pixel electrode in a state of applying a voltage to the TFT substrate such that green is displayed entirely upon liquid crystal display, a green color filter was formed on the pixel electrode (electrodeposition film forming step: Green).

Then, after cleaning with purified water, the electrodeposition solution was replaced with an electrode deposition solution in which a styrene-acrylic acid copolymer (molecular weight: 13,000, hydrophobic group/(hydrophilic group+hydrophobic group) molar ratio: 65%, acid value: 150), a phthalocyanine blue series super-micro particle pigment and ITO micro particles (grain size; about 50 nm) were dispersed at a 1:1:1 solid content ratio and, simultaneously, when voltage at 2.5 V was applied for the 10 seconds for the pixel electrode in a state of applying a voltage to the TFT substrate such that blue is displayed entirely upon liquid crystal display, a blue color filter was formed on the pixel electrode (electrodeposition film forming step: Blue).

The electrodeposition film forming steps are thus repeated and color filters each of a single color were successively formed on the exposed predetermined pixel electrodes and, as a result, a full color TFT-integrated type color filter in which the electrode and the power source line serve also as the black mask was formed.

In this Example 4, transparent micro particles of ITO were dispersed in the color filter layer, so that the conductivity of the color filter layer was improved to lower the voltage drop upon liquid crystal display driving.

Example 5

A TFT-integrated type color filter in which a color filter was formed integrally on the surface of a TFT substrate was obtained in the same manner as in Example 1 except for applying for two minutes a voltage at 10 V by a potentiostat to the source electrode of the TFT in the step of forming an electrodeposition film for each of colors red, green and blue in Example 1.

Example 6

A TFT-integrated type color filter in which a color filter was formed integrally on the surface of a TFT substrate was obtained in the same manner as in Example 2 except for applying for two minutes a voltage at 10 V by a potentiostat to the source electrode of the TFT in the step of forming an electrodeposition film for each of colors red, green and blue in Example 2.

Example 7

A TFT-integrated type color filter in which a color filter was formed integrally on the surface of a TFT substrate was obtained in the same manner as in Example 2 except for applying for two minutes a voltage at 10 V by a potentiostat to the source electrode of the TFT in the step of forming an electrodeposition film for each of colors red, green and blue in Example 3.

Example 8

A TFT-integrated type color filter in which a color filter was formed integrally on the surface of a TFT substrate was obtained in the same manner as in Example 2 except for applying for two minutes a voltage at 10 V by a potentiostat to the source electrode of the TFT in the step of forming an electrodeposition film for each of colors red, green and blue in Example 4.

Example 9

Figure 4:
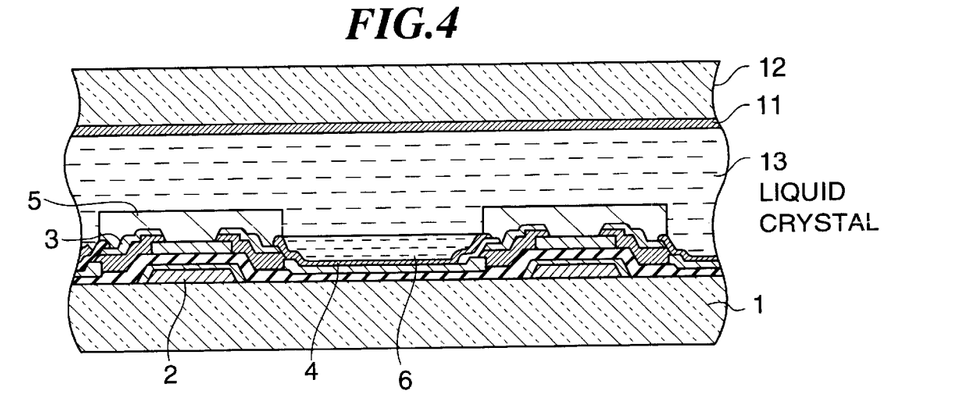
FIG. 4 is a schematic cross sectional views illustrating for an embodiment of a liquid crystal display element.

A TFT-integrated type color filter formed in Example 5 and a glass substrate 12 entirely formed with an ITO transparent electrode 11 were laminated by way of a spacer, to form a space between the transparent electrode 11 and the TFT-integrated type color filter. Nematic liquid crystals 13 were filled in the space to obtain a liquid crystal display element shown in FIG. 4.

Example 10

Figure 5:
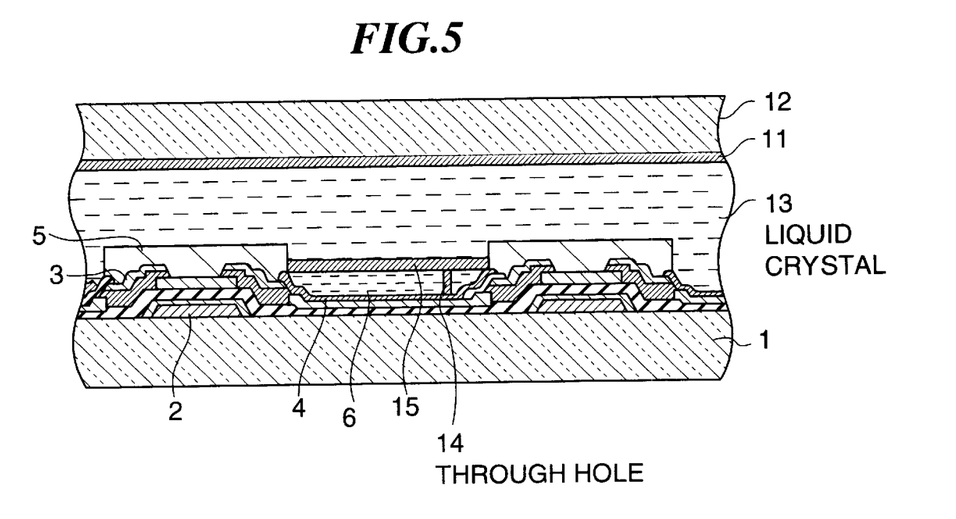
FIG. 5 is a schematic cross sectional views illustrating for another embodiment of a liquid crystal display element

In Example 9, an ITO was deposited by a sputtering method on a colored electrodeposition film, and then the film was removed while leaving only each of the filter portions by a photolithographic step and a transparent conductive display electrode portion 15 was formed to an upper layer portion of the filter portion. The electrode for display was laminated with the electrodeposition electrode below at the end face of the laminate to obtain conduction (through hole 14). The TFT driving circuit-integrated type color filter could thus be completed. In the same manner, liquid crystal materials were arranged to obtain a liquid crystal device shown in FIG. 5.

According to the method of manufacturing the color filter of the present invention, positional alignment between the color filter and the TFT substrate is no larger necessary, and a highly fine liquid crystal display element with a high aperture ratio can be manufactured at low cost. Further, defects in the TFT substrate such as disconnection failure or short circuit failure of the TFT circuit can be recognized by checking deposition or erroneous deposition of the color filter layer.

What is claimed is:

1. A method of manufacturing a thin film transistor-integrated type color filter, which comprises:
   a step of arranging and forming a thin film transistor and a transparent conductive film on a transparent substrate thereby forming a substrate for use in liquid crystal display; and
   a step of bringing said substrate into contact with an aqueous electrodeposition solution containing a colorant and an electrodepositing polymer, supplying an electric current, electrochemically changing the concentration of hydrogen ions thereby depositing the colorant on a transparent conductive film of said substrate and forming a conductive colored electrodeposition film.

2. The method of manufacturing a thin film transistor-integrated type color filter according to claim 1, wherein the method comprises:
   steps of coating a photoresist on said substrate and conducting etching by entering a light on the side not formed with a transparent electrode thereby exposing said transparent electroconductive film only at a predetermined region and driving a predetermined electrode in said transparent conductive film thus exposed, conducting said step of forming an electrodeposition film and forming a colored electrodeposition film at a predetermined portion to form a color filter of a single color and subsequently;
   repeating each of said steps while changing the hues of the colorants contained in the electrodeposition solution thereby forming a multi-color filter.

3. The method of manufacturing a thin film transistor-integrated type color filter according to claim 1, wherein the method comprises:
   arranging and forming a thin film transistor and a transparent conductive film by said step of manufacturing a substrate for use in liquid crystal display and then disposing a protection layer on said thin film transistor to form an insulation film, driving a predetermined electrode in the exposed transparent conductive film with no provision of said protection layer, conducting said electrodeposition film forming step and forming a colored electrodeposition film at a predetermined portion to form a color filter of a single color and subsequently;

repeating each of said steps while changing the hues of the colorants contained in the electrodeposition solution thereby forming a multi-color filter.

4. The method of manufacturing a thin film transistor-integrated type color filter according to claim 1, wherein the method comprises:

arranging and forming a thin film transistor and a transparent conductive film by said step of manufacturing a substrate for use in liquid crystal display, then coating a positive type black resist on said thin film transistor, applying a step of forming a black matrix of conducting etching by irradiating a light from the side not formed with said transparent electrode thereby forming a black matrix, driving a predetermined electrode in the exposed transparent conductive film not formed with a black matrix, conducting said electrodeposition film forming step and forming a colored electrodeposition film to the predetermined portion to form a color filter of a single color and subsequently;

repeating each of said steps while changing the hues of the colorants contained in the electrodeposition solution thereby forming a multi-color filter.

5. The method of manufacturing a thin film transistor-integrated type color filter according to claim 1, wherein a color filter is formed by said manufacturing method according to claim 1 and then a black matrix forming step for forming an insulative black matrix in applied.

6. The method of manufacturing a thin film transistor-integrated type color filter according to claim 2, further comprising a step of removing the resist, disposing an insulation protection layer to provide insulation from both of the color filter and the thin film transistor, and applying a black matrix forming step of forming a black matrix on the protection layer.

7. The method of manufacturing a thin film transistor-integrated type color filter according to claim 1, wherein said electrode is prepared by using a material of low reflectivity and providing said electrode with the same function as the black matrix when said thin film transistor and said transparent conductive film are arranged and formed by said step of manufacturing the substrate.

8. The method of manufacturing a thin film transistor-integrated type color filter according to claim 1, wherein said method comprises the steps of preparing an electrode by using a material of low reflectivity, an insulation layer is disposed further to said electrode and, subsequently, a pixel electrode is formed thereby providing said electrode and an electrode line with the same function and that of the black matrix when said thin film transistor and said transparent conductive film are arranged and formed by said step of manufacturing the substrate.

9. The method of manufacturing a thin film transistor-integrated type color filter according to claim 1, wherein an electrodeposition material used for said electrodeposition solution contains a conductive pigment or a conductive polymer having a nature of changing the solubility and causing precipitation due to the change of the concentration of hydrogen ions.

10. The method of manufacturing a thin film transistor-integrated type color filter according to claim 1, wherein an electrodeposition material used for said electrodeposition solution contains a conductive polymer which is a copolymer of monomers having hydrophobic groups and hydrophilic groups and in which the ratio of the number of hydrophobic groups based on the total number of the hydrophobic groups and the hydrophilic groups is from 40% to 50%, and a colorant.

11. The method of manufacturing a thin film transistor-integrated type color filter according to claim 10. wherein a transparent conductive material is further added to said electrodeposition solution to form a conductive electrodeposition film, to provide a conductive color filter.

12. The method of manufacturing a thin film transistor-integrated type color filter having a conductive color filter according to claim 1, wherein a salt giving no undesired effect on the characteristics of said thin film transistor is added to said electrodeposition solution to form a conductive electrodeposition film.

13. The method of manufacturing a thin film transistor-integrated type color filter according to claim 1, wherein a colorant of high conductivity in added to said electrodeposition solution to form a conductive electrodeposition film.

14. The method of manufacturing a thin film transistor-integrated type color filter providing conductive color filter according to claim 1, wherein a conductive electrodeposition film is formed as said electrodeposition material by using an electrodepositing polymer and a conductive colorant at such a ratio of the polymer of 1.5 or less based on 1 of said conductive colorant as the weight % concentration ratio between said conductive polymer and said conductive colorant thereby forming a conductive color filter.

15. The method of manufacturing a thin film transistor-integrated type color filter according to claim 10, wherein a protection layer is formed on said electrode film in a state of containing water in said electrodeposition film, so that static charges can be transferred in said electrodeposition film.

16. The method of manufacturing a thin film transistor-integrated type color filter according to claim 1, wherein an electrodeposition film is formed at an electrodeposition voltage of 3 V or lower in said step of forming an electrodeposition film.

17. The method of manufacturing a thin film transistor-integrated type color filter according to claim 1, wherein a two-layered or three-layered Cr film is used for an electrode in forming a thin film transistor in said step of manufacturing the substrate for use in liquid crystal display.

18. A method of manufacturing a color filter-integrated type driving device comprising the following steps of:

bringing said pixel electrode of a transparent substrate comprising a thin film transistor, and a pixel electrode connected to a driven electrode of said thin film transistor into contact with an electrodeposition solution containing a water soluble polymer capable of deposition or precipitation in accordance with pH change, and a coloring pigment, and applying a voltage to said pixel electrode thereby changing pH of said electrodeposition solution near said pixel electrode and depositing a colored electrodeposition film comprising said water soluble polymer and said coloring pigment on said pixel electrode.

19. The colored electrodeposition film according to claim 18, further comprising a stop of forming a transparent conductive film on said colored electrodeposition film.

20. A method of manufacturing a thin film transistor-integrated type color filter, which comprises:

a step of arranging and forming a thin film transistor and a transparent conductive film on a transparent substrate thereby forming a substrate for use in liquid crystal display; and a step of bringing said substrate for use in liquid crystal display into contact with an aqueous electrodeposition solution containing a colorant and an electrodepositing polymer, supplying an electric current through the thin film transistor, electrochemically changing the concentration of hydrogen ions thereby depositing the colorant on a transparent conductive film of said substrate for use in liquid crystal display and forming a conductive colored electrodeposition film.

21. The method of manufacturing a thin film transistor-integrated type color filter according to claim 20, wherein an electrodeposition film is formed at an electrodeposition voltage of 20 V or lower in said step of forming an electrodeposition film.

* * * * *